United States Patent [19]

Sano et al.

[11] 4,230,980
[45] Oct. 28, 1980

[54] BIAS CIRCUIT

[75] Inventors: Yoshiaki Sano; Toshio Hanazawa, both of Kawasaki; Hideo Honda, Yokohama, all of Japan

[73] Assignee: Fujitsu Limited, Japan

[21] Appl. No.: 40,406

[22] Filed: May 18, 1979

[30] Foreign Application Priority Data

May 24, 1978 [JP] Japan .................................. 53-61927

[51] Int. Cl.$^3$ .............................................. G05F 3/20
[52] U.S. Cl. ......................................... 323/19; 323/1; 330/296
[58] Field of Search .................... 307/296 R; 323/1, 4, 323/16, 19, 22 T; 330/296, 297, 127

[56] References Cited

U.S. PATENT DOCUMENTS

| 3,742,338 | 6/1973 | Sugano et al. | 323/22 T |
|---|---|---|---|
| 3,743,850 | 7/1973 | Davis | 307/296 R |
| 3,911,353 | 10/1975 | van de Plassche | 323/1 |
| 3,914,683 | 10/1975 | van de Plassche | 323/1 |

Primary Examiner—A. D. Pellinen
Attorney, Agent, or Firm—Staas & Halsey

[57] ABSTRACT

A bias circuit for generating bias voltages or bias currents including first and second elements for generating a voltage corresponding to the sum of two voltage drops in a forward p-n junction; first and second transistors for generating a negative feedback current; at least one resistor for determining the value of a constant current for generating bias voltages; a negative feedback circuit; a third resistor connected in the feedback circuit, and; a starting element for supplying currents to the first and second elements and to the first and second transistors in an initial state when the power is turned on, whereby the feedback circuit operates to generate the constant current which is used for forming bias voltages.

12 Claims, 6 Drawing Figures

BIAS CIRCUIT

BACKGROUND OF THE INVENTION

(1) Field of the Invention

The present invention relates generally to a bias circuit and, more particularly, to a bias circuit for generating bias voltages, i.e., constant voltages, which may be, for example, supplied to the inputs of a pre-—amplifier and to the inputs of an input stage of a power amplifier, in an audio-amplifier.

(2) The Prior Art

In a pre-amplifier or an input stage of a power amplifier, in order to stabilize its operation, it is necessary to apply stable bias voltages to the inputs of the pre-amplifier or the like. In addition, in recent years, the pre-amplifier or the like has been manufactured by using semiconductor technology, especially, integrated circuit technology, so the bias voltages applied to the pre-amplifier or the like are relatively low. Therefore, it is necessary to apply low and stable bias voltages to the pre-amplifier or the like.

One prior art bias circuit for generating bias voltages which may be, for example, applied to the inputs of a pre-amplifier or the like, is composed of diodes whose forward voltages serve as bias voltages. However, the change of the voltage applied to the diodes varies the forward resistance of the diodes, i.e., varies the forward voltages of the diodes. Therefore, the bias voltages generated from the bias circuit formed by diodes are unstable with respect to the change of the power voltage supplied to the bias circuit.

Another prior art bias circuit is composed of Zener diodes whose Zener voltages serve as bias voltages. The bias voltages generated from the bias circuit formed by Zener diodes are stable with respect to the change of the power voltage supplied to the bias circuit. However, it is difficult to generate a low bias voltage, for example, less than 5 volts.

SUMMARY OF THE INVENTION

Therefore, a principal object of the present invention is to provide a bias circuit for generating low bias voltages which are stable with respect to the change of the power voltage supplied to the bias circuit.

It is another object of the present invention to provide a bias circuit for generating bias currents which are stable with respect to the change in power voltage supplied to the bias circuit.

The present invention provides a bias circuit for generating bias voltages or bias currents comprising: first and second elements for generating a voltage corresponding to the sum of two voltage drops in a forward p-n junction; first and second transistors for setting a negative feedback current; at least one resistor for determining the value of a constant current for generating bias voltages; a negative feedback circuit; a third resistor connected in the feedback circuit, and; a starting element for supplying currents to the first and second elements and to the first and second transistors in an initial state when the power is turned on, whereby the feedback circuit operates to generate the constant current which is used for forming bias voltages.

The present invention will be more apparent from the following description with reference to the accompanying drawings.

DETAILED DESCRIPTION OF THE PREFERRED EMBODIMENTS

Figure 1:
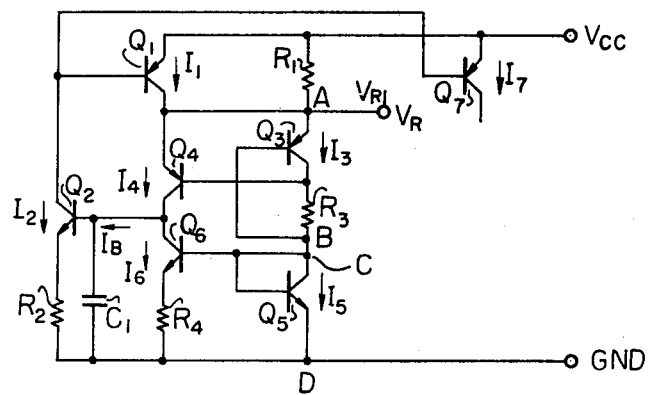
FIG. 1 is a circuit diagram illustrating a first embodiment of the bias circuit according to the present invention.

Referring to FIG. 1, the bias circuit comprises a starting resistor $R_1$, a first circuit formed by a transistor $Q_3$, a resistor $R_3$ and a transistor $Q_5$ connected in series, a second circuit formed by two transistors $Q_4$ and $Q_6$ and a resistor $R_4$ connected in series, and a third circuit for supplying constant currents to the first and second circuits, formed by two transistor $Q_1$ and $Q_2$. $V_{cc}$, $V_R$ and GND indicate, a d.c. supply terminal, an output terminal of the bias circuit and a grounded terminal, respectively. $C_1$ is a phase-compensating capacitor for preventing the generation of a positive feedback by the phase shift of a high frequency which may invite the oscillation of the negative feedback loop composed of the transistors $Q_1$, $Q_6$ $Q_4$ and $Q_2$ and a resistor $R_2$. Therefore, if there is no possibility of such oscillation, the phase-compensating capacitor $C_1$ can be omitted. $R_2$ is a resistor for restricting the base current of the transistor $Q_1$ and stabilizing the gain of the negative feedback loop.

The operation of the bias circuit of FIG. 1 is as follows.

Figure 2:
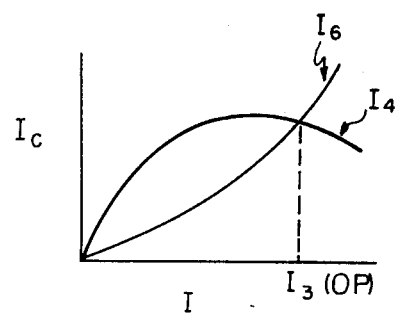
FIG. 2 is a graph showing the relationship between the current $I_3$ and the currents $I_4$ and $I_6$, appearing in FIG. 1.

When the d.c. supply is turned on, a forward voltage is applied to the emitter of the transistor $Q_1$. However, since the transistor $Q_2$ does not conduct yet, the base current of the transistor $Q_1$ does not flow, so that the transistor $Q_1$ does not conduct. Therefore, current supplied from the d.c. supply flows only through two paths, one of which is composed of the resistor $R_1$, the transistor $Q_3$, the resistor $R_3$ and the transistor $Q_5$, while the other is composed of the resistor $R_1$, the transistor $Q_4$, the transistor $Q_6$ and the resistor $R_4$. These transistors $Q_3$, $Q_4$, $Q_5$ and $Q_6$ are selected so as to satisfy the formulas (1) and (2) below.

$$S_{E4} > S_{E3} \quad (1)$$

$$S_{E5} = S_{E6} \quad (2)$$

where $S_{E3}$, $S_{E4}$, $S_{E5}$ and $S_{E6}$ are the emitter areas of the transistors $Q_3$, $Q_4$, $Q_5$ and $Q_6$, respectively. As a result, as shown in FIG. 2, in an initial state wherein the collector current $I_3$ of the transistor $Q_3$ is relatively low, the collector current $I_4$ of the transistor $Q_4$ is greater than the collector current $I_6$ of the transistor $Q_6$. Therefore, a current $I_B$ which equals ($I_4-I_6$) is supplied to the base of the transistor $Q_2$, so that the transistor $Q_2$ conducts. This conduction of the transistor $Q_2$ causes the base current of the transistor $Q_1$ to flow. As a result, the transistor $Q_1$ also conducts. Therefore, the current which is supplied from the d.c. supply terminal $V_{cc}$ to the transistors $Q_3$ and $Q_4$ flows through the transistor $Q_1$, not through the starting resistor $R_1$. Thus, the operation of the starting resistor $R_1$ is completed. In order to maintain the transistor $Q_1$, conductive it is preferable that the value of the starting resistor $R_1$ be selected between the value of the saturation resistance and the value of the cut-off resistance in the transistor $Q_1$. It should be noted that a junction FET (Field Effect Transistor), or other switching means which may effect the above-mentioned operation, can also be employed instead of the resistor $R_1$.

In the bias circuit of FIG. 1 in which the transistor $Q_1$ is conducting, the base current $I_B$ of the transistor $Q_2$ is selected to be small and neglible compared with the currents $I_4$ and $I_6$. The actual value of the current $I_B$ is $I_1/\beta\beta'$ where $I_1$ is the collector current, and $\beta$ and $\beta'$ are the current amplification factors of the transistors $Q_1$ and $Q_2$, respectively. As a result, the current $I_4$ and the current $I_6$ are nearly equal. This corresponds to the state when the current $I_3$ equals $I_3(OP)$ in FIG. 2. In addition, the current $I_6$ is fixed to be a constant value by the collector-base connected transistor $Q_5$, which serves as a diode. This causes the currents $I_1$ and $I_2$ to be constant, so that the currents $I_3$ and $I_5$, which are equal, are also constant. Therefore, a voltage at the point A, namely, at the terminal $V_R$, is constant, which voltage $V_{R1}$ can be expressed as follows.

$$V_{R1} = V_{BE3} + V_{BE5} \tag{3}$$

where $V_{BE3}$ and $V_{BE5}$ are the base-emitter voltages of the transistors $Q_3$ and $Q_5$, respectively. The bias voltage $V_{R1}$ is a constant voltage regardless of the change of the d.c. supply voltage, since such a change of voltage is absorbed in the emitter-collector voltage $V_{EC}$ of the transistor $Q_1$.

The selection of the transistors $Q_3$ through $Q_6$ and the resistors $R_3$ and $R_4$ of FIG. 1 will be explained below.

$V_{BE3}$ and $V_{BE5}$ in the equation (3) can be expressed as follows.

$$V_{BE3} = I_3 R_3 + V_{BE4} \tag{4}$$

$$V_{BE5} = I_6 R_4 + V_{BE6} \tag{5}$$

where $V_{BEi}$ is the base-emitter voltage of the transistor $Q_i$ ($i$ equals 3 through 6). In general, $$V_{BE} = \frac{kT}{q} \ln \frac{I_c}{I_s} \tag{6}$$

where
k: Boltzmann's constant
T: Absolute temperature
q: Charge
$I_c$: Collector current
$I_s$: Saturated base-emitter current.

Then, the equations (4) and (5) can be rewritten as follows.

$$I_3 R_3 = \frac{kT}{q} \ln \left( \frac{I_3}{I_4} \frac{I_{s4}}{I_{s3}} \right) \tag{7}$$

$$I_6 R_6 = \frac{kT}{q} \ln \left( \frac{I_5}{I_6} \frac{I_{s6}}{I_{s5}} \right) \tag{8}$$

where $I_{si}$ is the saturated base-emitter current of the transistor $Q_i$ ($i$ equals 3 through 6). In general, in a monolithic integrated circuit manufactured on a chip, the saturated base-emitter current of a transistor is in proportion to the area of the emitter of the transistor. When a plurality of transistors whose emitter areas are the same are connected in parallel, the saturated base-emitter current as a whole is in proportion to the number of the parallel-connected transistors. Therefore, defining two constants $n_1$ and $n_2$ as $I_{s4}/I_{s3}$ and $I_{s5}/I_{s6}$, respectively, and using the condition that $I_3 = I_5$ and $I_4 = I_6$, the equation (9) is obtained.

$$I_3 R_3 = \frac{kT}{q} \ln \frac{I_3 R_4 n_1}{I_3 R_3 - \frac{kT}{q} \ln \frac{n_1}{n_2}} \tag{9}$$

Thus, as understood from the equation (9), the constant value of the current $I_3$ can be determined by selecting four values, namely, the two constants $n_1$ and $n_2$ depending upon the emitter areas of the transistors $Q_3$ through $Q_6$ and the two values of the resistor $R_3$ and $R_4$. As a result, the voltage $V_{R1}$ at the point A becomes a constant voltage.

In the bias circuit of FIG. 1, since a constant voltage can be obtained by causing the current $I_3$ to be constant, a plurality of constant voltages can also be obtained by inserting one or more diodes between the points B and C. For example, a low bias voltage which is n-times of a base-emitter voltage $V_{BE}$ of a transistor can be obtained by inserting a plurality of transistors which serve as diodes.

In FIG. 1, a transistor $Q_7$, whose base and emitter are connected to the base of the transistor $Q_1$, and the d.c. supply terminal $V_{cc}$, respectively, serves as a constant d.c. supply source. The collector current of the transistor $Q_7$ is a constant current which is in proportion to the current $I_1$ and the ratio of the emitter area of the transistor $Q_7$ to that of the transistor $Q_1$.

Figure 3:
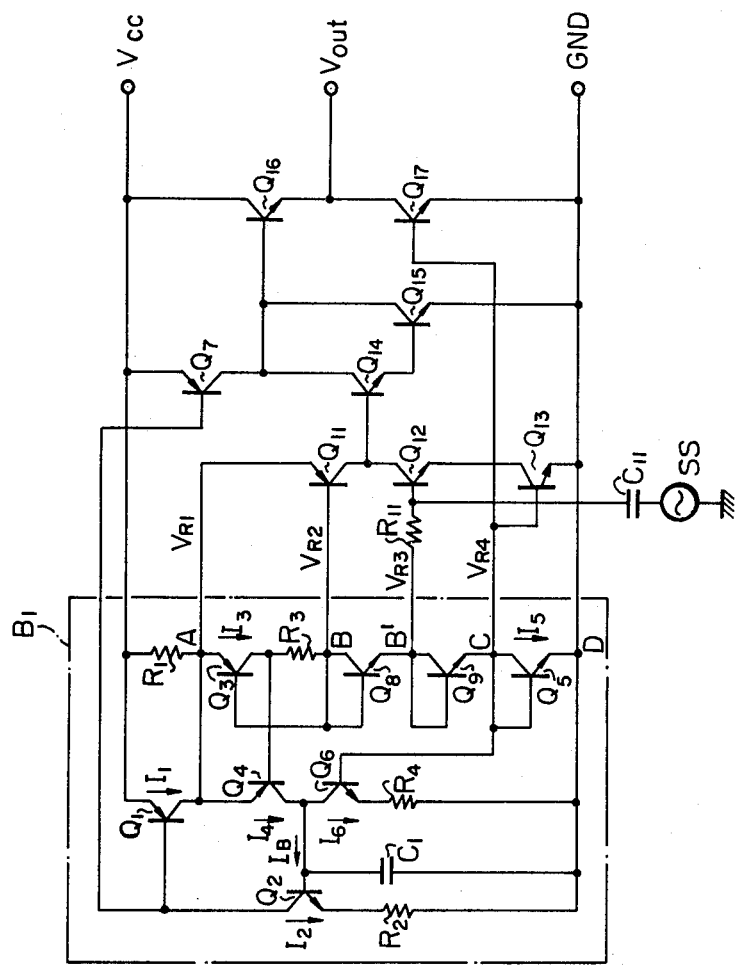
FIG. 3 is a circuit diagram illustrating the bias circuit of FIG. 1 connected to a pre-amplifier of an audio-amplifier.

FIG. 3 is a circuit diagram illustrating the bias circuit of FIG. 1 connected to a pre-amplifier of an audio-amplifier. In FIG. 3, the elements illustrated in FIG. 3 which are identical with those of FIG. 1 are given the same reference numerals as in FIG. 1. In FIG. 3, the bias circuit $B_1$ further includes two transistors $Q_8$ and $Q_9$ which serve as diodes, in addition to the bias circuit of FIG. 1, so that four bias voltages $V_{R1}$, $V_{R2}$, $V_{R3}$ and $V_{R4}$ are obtained at the terminals A, B, B' and C, respectively. The pre-amplifier of FIG. 3 is composed of a signal source SS, a capacitor $C_{11}$ for cutting off the direct-current component of the input signal, an input resistor $R_{11}$, an input transistor $Q_{12}$, two bias transistors $Q_{11}$ and $Q_{13}$ for the input transistor $Q_{12}$, two Darlington-connected transistors $Q_{14}$ and $Q_{15}$ which serve as an amplifier, a bias transistor $Q_7$ for the two transistors $Q_{14}$ and $Q_{15}$, and two output transistors $Q_{16}$ and $Q_{17}$ connected in series. In this case, the bias transistor $Q_7$ supplies a bias current, which is stable regardless of the change of the d.c. supply voltage, to the transistors $Q_{14}$ and $Q_{15}$. The terminal $V_{out}$ between the output transistors $Q_{16}$ and $Q_{17}$ is an output terminal of the pre-amplifier. Thus, the bias circuit of FIG. 1 is applicable to a pre-amplifier which needs a plurality of bias voltages and a bias current.

Figure 4:
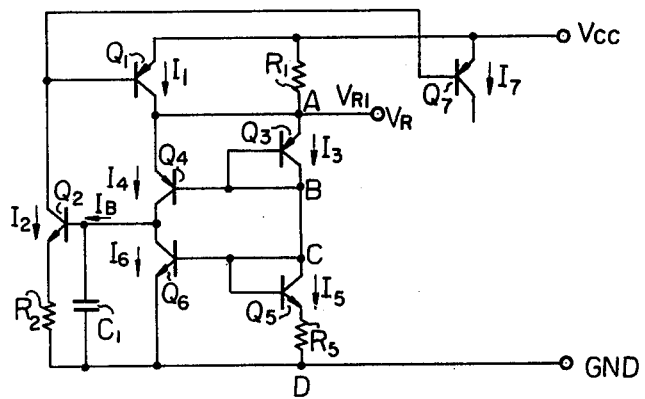
FIG. 4 is a circuit diagram illustrating a second embodiment of the bias circuit according to the present invention.

FIG. 4 is a circuit diagram illustrating a second embodiment of the bias circuit according to the present invention. In FIG. 4, the elements illustrated in FIG. 4 which are identical with those of FIG. 1 are given the same reference numerals as in FIG. 1. Although the bias circuit of FIG. 1 includes two resistors $R_3$ and $R_4$ for determining the magnitude of a constant current therein, the bias current of FIG. 4 includes a resistor $R_5$ instead of the resistor $R_3$ and $R_4$.

The operation of the bias circuit of FIG. 4 is as follows.

Figure 5:
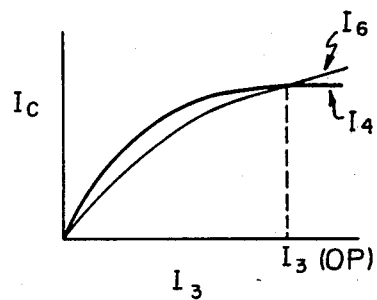
FIG. 5 is curves showing the relations between the current $I_3$ and the currents $I_4$ and $I_6$, appearing in FIG. 4.

In the same way as mentioned in the case of FIG. 1, when the d.c. supply is turned on, current supplied by the d.c. supply flows only through two paths, one of which is composed of the resistor $R_1$, the transistors $Q_3$ and $Q_5$ and the resistor $R_5$, while the other is composed of the resistor $R_1$, and the transistors $Q_4$ and $Q_6$. These transistors $Q_3$, $Q_4$, $Q_5$ and $Q_6$ are selected so as to satisfy the formulae (1)' and (2)' as follows.

$$S_{E4} > S_{E3} \quad (1)'$$

$$S_{E5} > S_{E6} \quad (2)'$$

where $S_{E3}$, $S_{E4}$, $S_{E5}$ and $S_{E6}$ are the emitter areas of the transistors $Q_3$, $Q_4$, $Q_5$ and $Q_6$, respectively. As a result, as shown in FIG. 5, in an initial state, wherein the collector current $I_3$ of the transistor $Q_3$ is relatively low, the collector current $I_4$ of the transistor $Q_4$ is greater than the collector current $I_6$ of the transistor $Q_6$. Therefore, a current $I_B$ which equals $(I_4-I_6)$ is supplied to the base of the transistor $Q_2$, so that the transistor $Q_2$ conducts, and after that, the transistor $Q_1$ conducts. Then, the current which is supplied from the d.c. supply terminal $V_{cc}$ to the transistors $Q_3$ and $Q_4$ flows through the transistor $Q_1$, not through the resistor $R_1$. Thus, the operation of the starting resistor $R_1$ is completed.

In the bias circuit of FIG. 4, in which the transistor $Q_1$ is conducting, the base current $I_B$ of the transistor $Q_2$ is selected to be negligible compared with the currents $I_4$ and $I_6$. As a result, the current $I_4$ and the current $I_6$ are nearly equal, which corresponds to the state when the current $I_3$ equals $I_3$ (OP) in FIG. 5. In addition, the current $I_6$ is fixed to be a constant value by the collector-base connected transistor $Q_5$, which serves as a diode. This causes the currents $I_1$ and $I_2$ to be constant, so that the currents $I_3$ and $I_5$ are also constant. Therefore, a voltage at the point A, namely, at the terminal $V_R$, is constant, and the voltage $V_{R1}$ can be expressed as follows.

$$V_{R1} = V_{BE4} + V_{BE6} \quad (3)'$$

where $V_{BE4}$ and $V_{BE6}$ are the base-emitter voltages of the transistors $Q_4$ and $Q_6$, respectively.

The selection of the transistors $Q_3$ through $Q_6$ and the resistor $R_5$ of FIG. 4 will be explained below.

$V_{BE4}$ and $V_{BE6}$ in the equation (3)' can be expressed as follows.

$$V_{BE4} = V_{BE3} \quad (4)'$$

$$V_{BE6} = V_{BE5} + I_5 R_5 \quad (5)'$$

where $V_{BEi}$ is the base-emitter voltage of the transistor $Q_i$ (i equals 3 through 6). In general, as mentioned above, in the equation (6)

$$V_{BE} = \frac{kT}{q} \ln \frac{I_C}{I_s} \quad (6)'$$

Then, the equations (4)' and (5)' can be rewritten as follows.

$$\frac{kT}{q} \ln \left( \frac{I_3}{I_4} \cdot \frac{I_{s4}}{I_{s3}} \right) = 0 \quad (7)'$$

$$I_5 R_5 = \frac{kT}{q} \ln \left( \frac{I_6}{I_5} \cdot \frac{I_{s5}}{I_{s6}} \right) \quad (8)'$$

Therefore, defining two constant $n_1$ and $n_2$ as $I_{s4}/I_{s3}$ and $I_{s5}I_{s6}$, respectively, and using the condition that $I_3 = I_5$ and $I_4 = I_6$, the equation (9)' is obtained.

$$I_5 R_5 = \frac{kT}{q} \ln (n_1 n_2) \quad (9)'$$

Thus as understood from the equation (9)', the constant value of the current $I_3$ which equals the current $I_5$ can be determined by selecting three values namely, the two constant $n_1$ and $n_2$, depending upon the emitter areas of the transistors $Q_3$ through $Q_6$ and the value of the resistor $R_5$. As a result, the voltage $V_{R1}$ at the point A becomes a constant voltage.

In the bias circuit of FIG. 4, a plurality of constant voltages can also be obtained by inserting one or more diodes between the points B and C.

Figure 6:
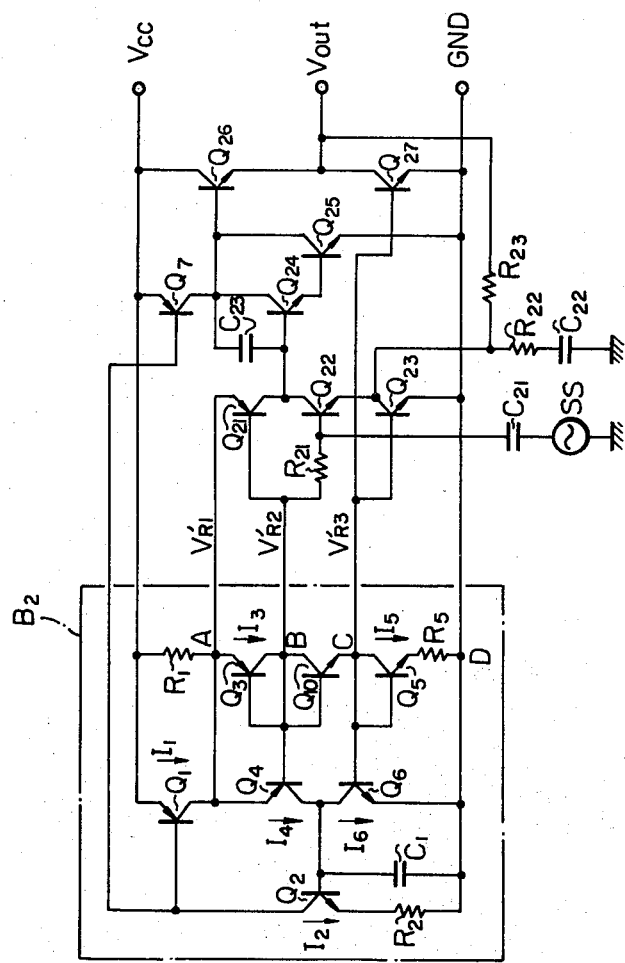
FIG. 6 is a circuit diagram illustrating the bias circuit of FIG. 4 connected to a pre-amplifier of an audio-amplifier.

FIG. 6 is a circuit diagram illustrating the bias circuit of FIG. 4 connected to a pre-amplifier of an audio-amplifier. In FIG. 6, the elements illustrated in FIG. 6 which are identical with those of FIG. 4 given the same reference numerals as in FIG. 4. In FIG. 6, the bias circuit $B_2$ further includes a transistor $Q_{10}$, in addition to the bias circuit of FIG. 4, so that three bias voltages $V'_{R1}$, $V'_{R2}$ and $V'_{R3}$ are obtained at the terminals A, B and C, respectively. The pre-amplifier of FIG. 6 is composed of a signal source SS, a capacitor $C_{21}$ for cutting off the direct-current component of the input signal, an input resistor $R_{21}$, an input transistor $Q_{22}$, two bias transistors $Q_{21}$ and $Q_{23}$ for the input transistor $Q_{22}$, two Darlington-connected transistors $Q_{24}$ and $Q_{25}$, which serve as an amplifier, a bias transistor $Q_7$ for two transistors $Q_{24}$ and $Q_{25}$, and two output transistors $Q_{26}$ and $Q_{27}$ connected in series. Also, in this case, the bias transistor $Q_7$ supplies a bias current, which is stable regardless of the change of the d.c. supply voltage, to the transistors $Q_{24}$ and $Q_{25}$. The terminal $V_{out}$ between the output transistor $Q_{26}$ and $Q_{27}$ is an output terminal of the pre-amplifier. $R_{22}$ and $R_{23}$ are resistors for determining the ratio of the feedback of the pre-amplifier and $C_{22}$ is a capacitor for cutting off the direct-current component in the feedback current of the pre-amplifier. $C_{23}$ is a capacitor for cutting off the high-frequency component of the input signal. Thus, the bias circuit of FIG. 4 is applicable to a pre-amplifier which needs a plurality of bias voltages and a bias current.

As explained hereinbefore, the bias circuit according to the present invention has the following advantages as compared with those of the prior art.

(1) A bias voltage generated from the bias circuit is stable regardless of the change of the d.c. supply $V_{cc}$, since such a change can be absorbed by the transistor $Q_1$.

(2) A bias voltage generated from the bias circuit is relatively low, since the bias circuit can generate a constant current which causes the bias voltage by using diodes or the like whose forward resistance is relatively small.

(3) The bias circuit also can generate a bias current which is stable regardless of the change of the d.c. supply $V_{cc}$.

What is claimed is:

1. A bias circuit, having a d.c. supply terminal, a bias output terminal, and a reference potential terminal, comprising:

first and second elements arranged in series between the bias output terminal and the reference potential terminal of said bias circuit, said first and second elements generating a voltage between the bias output terminal and the reference potential terminal, said voltage being equal to the sum of two voltage drops in a forward p-n junction;

first and second transistors connected in series, the collectors of said first and second transistors being connected at a node, each of said first and second transistors having a base which is connected to a terminal between said first and second elements, wherein said first and second transistors generate a difference current at said node equal to the difference between the collector currents of said first and second transistors;

resistor means, operatively connected to said second element, for determining the value of a constant current for generating bias voltages;

a third transistor arranged between the bias output terminal and the d.c. supply terminal;

a negative feedback circuit arranged between the base of said third transistor and said node, said difference current being introduced as an input thereto;

a starting element, connected to the d.c. supply terminal, for supplying currents to said first and second elements and to said first and second transistors in an initial state when the power is turned on, whereby said negative feedback circuit operates to generate said constant current.

2. A bias circuit as set forth in claim 1, wherein said resistor means comprises a first resistor connected between said first and second elements and a secnod resistor operatively connected to said second transistor.

3. A bias circuit as set forth in claim 1, wherein said resistor means comprises of a single resistor connected to said second element.

4. A bias circuit as set forth in claim 1, wherein said bias circuit further comprises a fourth transistor whose base and emitter are connected to the base and the emitter of said third transistor, respectively, whereby a collector current of said fourth transistor may be obtained as a bias current.

5. A bias circuit as set forth in claim 1, further comprising at least one diode arranged between said first and second elements, whereby a plurality of bias voltages may be output from the terminals of said at least one diode.

6. A bias circuit as set forth in claim 5, wherein said at least one diode is a base-collector connected transistor.

7. A bias circuit as set forth in claim 1, wherein each of said first and second elements is a transistor.

8. A bias circuit as set forth in claim 1, wherein said starting element is a resistor.

9. A bias circuit, having a voltage supply terminal, a ground terminal, and an output terminal, comprising:

a first transistor, having a collector, emitter and base, said first transistor emitter operatively connected to the voltage supply terminal and said first transistor collector operatively connected to the output terminal;

a first resistor operatively connected between the voltage supply terminal and the output terminal;

a second transistor, having a collector, emitter and base, said second transistor collector operatively connected to said first transistor base;

a second resistor operatively connected to said second transistor emitter and to the ground terminal;

a first capacitor operatively connected to said second transistor base and to the ground terminal;

a third transistor, having a collector, emitter and base, said third transistor emitter operatively connected to the output terminal and said third transistor base operatively connected to said third transistor collector;

a fourth transistor, having a collector, emitter and base, said fourth transistor emitter operatively connected to the output terminal, said fourth transistor base operatively connected to said third transistor collector and said third transistor base, and said fourth transistor collector operatively connected to said second transistor base and said first capacitor;

a fifth transistor, having a collector, emitter and base, said fifth transistor base and collector operatively connected to said third transistor base, said fifth transistor emitter operatively connected to the ground terminal;

a sixth transistor, having a collector, emitter and base, said sixth transistor collector operatively connected to said fourth transistor collector, said second transistor base, and said first capacitor, said sixth transistor base operatively connected to said fifth transistor base and collector, said sixth transistor emitter operatively connected to the ground terminal; and a seventh transistor, having a collector, emitter and base, said seventh transistor emitter operatively connected to the voltage supply terminal, said seventh transistor base operatively connected to said first transistor base and said second transistor collector.

10. The bias circuit as set forth in claim 9, further comprising:

a third resistor operatively connected between said third transistor collector and base; and a fourth resistor operatively connected between said sixth transistor emitter and the ground terminal.

11. The bias circuit as set forth in claim 10, further comprising at least one diode operatively connected between said third resistor and said fifth transistor collector.

12. The bias circuit as set forth in claim 9, further comprising a third resistor operatively connected between said fifth transistor emitter and the ground terminal.

* * * * *

UNITED STATES PATENT AND TRADEMARK OFFICE
CERTIFICATE OF CORRECTION

PATENT NO. : 4,230,980

DATED : October 28, 1980

INVENTOR(S) : SANO et al.

It is certified that error appears in the above—identified patent and that said Letters Patent is hereby corrected as shown below:

Column 2, line 15, "curves" should be --a graph--; "relations" should be --relationship--;

Column 2, line 31, "transistor" should be --transistors--;

Column 2, line 32, after "indicate" delete --,--;

Column 2, line 38, after "Q_6" insert --,--.

Column 3, line 9, ", conductive" should be --conductive,--;

Column 5, line 11, "resistor" should be --resistors--;

UNITED STATES PATENT AND TRADEMARK OFFICE
CERTIFICATE OF CORRECTION

PATENT NO. : 4,230,980

DATED : October 28, 1980

INVENTOR(S) : SANO et al.

It is certified that error appears in the above—identified patent and that said Letters Patent is hereby corrected as shown below:

Column 6, line 3, after "(6)" insert --,--;

Column 6, lines 17 and 27, "constant" should be --constants--;

Column 6, line 24, after "thus" insert --,--;

Column 6, line 26, after "values" insert --,--.

Column 7, line 40, after "thereto;" insert --and--;

Column 7, line 49, "secnod" should be --second--.

Signed and Sealed this

Twenty-first Day of April 1981

[SEAL]

Attest:

RENE D. TEGTMEYER

Attesting Officer        Acting Commissioner of Patents and Trademarks